US011349473B2

(12) United States Patent
Hirsch et al.

(10) Patent No.: US 11,349,473 B2
(45) Date of Patent: May 31, 2022

(54) WIRING OF A SEMICONDUCTOR SWITCH

(71) Applicant: Siemens Aktiengesellschaft, Munich (DE)

(72) Inventors: Lucia Hirsch, Chemnitz (DE); Bernd Roppelt, Unterhaid (DE); Thomas Schwinn, Herzogenaurach (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/600,478

(22) PCT Filed: Feb. 26, 2020

(86) PCT No.: PCT/EP2020/055036
§ 371 (c)(1),
(2) Date: Sep. 30, 2021

(87) PCT Pub. No.: WO2020/200591
PCT Pub. Date: Oct. 8, 2020

(65) Prior Publication Data
US 2022/0094352 A1 Mar. 24, 2022

(30) Foreign Application Priority Data
Apr. 1, 2019 (EP) .................... 19166563

(51) Int. Cl.
*H03K 17/687* (2006.01)
*H03K 17/16* (2006.01)
(Continued)

(52) U.S. Cl.
CPC ......... *H03K 17/166* (2013.01); *H03K 17/567* (2013.01); *H03K 17/74* (2013.01)

(58) Field of Classification Search
CPC ..... H03K 17/166; H03K 17/567; H03K 17/74
See application file for complete search history.

(56) References Cited

U.S. PATENT DOCUMENTS 4,692,643 A * 9/1987 Tokunaga ............ H03K 17/102
327/436
5,376,831 A * 12/1994 Chen .................... H03K 17/166
327/111
(Continued)

FOREIGN PATENT DOCUMENTS

DE 19634612 A1 3/1998
EP 0730331 A2 9/1996
(Continued)

OTHER PUBLICATIONS

PCT International Search Report and Written Opinion of International Searching dated Mar. 16, 2021 corresponding to PCT International Application No. PCT/ EP2020/055036 filed Feb. 26, 2020.

*Primary Examiner* — Metasebia T Retebo
(74) *Attorney, Agent, or Firm* — Henry M. Feiereisen LLC

(57) ABSTRACT

A wiring of a semiconductor switch having a gate, a collector or a drain, and an emitter or a source, includes a first arrangement having a first capacitor connected in series with a parallel connection having a first resistor and a first diode. The first arrangement is connected between the gate and the collector or drain, wherein the first diode is connected away from the gate in a flow direction. A second arrangement is connected in parallel with the first arrangement and includes a second capacitor connected in series with a parallel connection having a second resistor and a second diode, wherein the second diode lies toward the gate in the flow direction.

3 Claims, 3 Drawing Sheets

(51) Int. Cl.
*H03K 17/567* (2006.01)
*H03K 17/74* (2006.01)

(56) References Cited

U.S. PATENT DOCUMENTS

| | | | | |
|---|---|---|---|---|
| 5,953,222 | A * | 9/1999 | Mizutani | H03K 17/08148 |
| | | | | 363/56.05 |
| 6,226,192 | B1 * | 5/2001 | Yamanaka | H02M 1/34 |
| | | | | 363/56.01 |
| 6,597,590 | B2 * | 7/2003 | Ikimi | H02M 7/487 |
| | | | | 363/58 |
| 7,173,836 | B2 * | 2/2007 | Chan | H02M 1/08 |
| | | | | 363/132 |
| 7,242,594 | B2 * | 7/2007 | Chan | H02M 1/08 |
| | | | | 327/112 |
| 2017/0149345 | A1 * | 5/2017 | Boe | H02M 5/458 |

FOREIGN PATENT DOCUMENTS

| | | |
|---|---|---|
| EP | 0902537 A2 | 3/1999 |
| EP | 3051697 A1 | 8/2016 |

\* cited by examiner

WIRING OF A SEMICONDUCTOR SWITCH

CROSS-REFERENCES TO RELATED APPLICATIONS

This application is the U.S. National Stage of International Application No. PCT/EP2020/055036, filed Feb. 26, 2020, which designated the United States and has been published as International Publication No. WO 2020/200591 A1 and which claims the priority of European Patent Application, Serial No. 19166563.7, filed Apr. 1, 2019, pursuant to 35 U.S.C. 119(a)-(d).

BACKGROUND OF THE INVENTION

The invention relates to a wiring of a semiconductor switch.

Voltage switching edges (du/dt) occur when switching semiconductors, for example IGBTs, MOSFETs, etc. These mostly progress in a nonlinear manner, meaning that it is necessary to take into consideration both a maximum voltage rate of rise (du/dt_max) and also an average voltage rate of rise (for example a 10%-90% value) for the IGBT tuning (gate resistor tuning).

The maximum voltage rate of rise in power semiconductors has to be limited for certain applications, as excessively high voltage edges cause problems with regard to electromagnetic compatibility (EMC), and also in the case of power electronic switches may lead to damage at the windings of any machines that may be connected.

In simple activation circuits, e.g. with only one gate resistor, the gate resistor is adjusted in order to set the maximum voltage rate of rise. If the maximum voltage rate of rise is limited by the gate resistor, then the average voltage rate of rise also slows down. Slowed switching operations lead to increased switching losses in the semiconductor switch, which has a negative effect on the service life of the semiconductor switch and the converter with an identical cooling system.

The aim is to reduce the maximum values of the voltage rate of rise during switching, without influencing the average voltage rate of rise, i.e. to linearize the switching edge.

It is known from the prior art, as shown in FIG. 1, to arrange a capacitor C1 between the collector C and the gate G for this purpose. Voltage edges in the load circuit bring about, via the capacitor C1, a displacement current which is guided back to the gate G and charges and discharges it such that it counteracts the switching edge (negative feedback).

This makes it possible to set the voltage edge, effectively regulated to a value.

The gate resistor wiring of V1, Rg1 and Rg2 shown in FIG. 1 is used to depict two mutually independent gate resistors Rg_on (Rg1 parallel to Rg2) and Rg_off (=Rg1). Decoupling the gate resistors would also bring about a diode in the opposite flow direction.

Due to the additional capacitance C1, however, the switching on and switching off are influenced to the same extent. In certain semiconductors (for example newer-generation IGBTs), an optimum capacitance value for the switching on brings about a slowing down of the switching procedure, which has to be compensated by a smaller gate resistor. In most cases, when switching off, although this leads to equal switching edges, it does not bring any improvement with regard to losses and leads to higher switching-off overvoltage.

To date, the problem has only been controlled by elaborate and expensive driver circuits (e.g. driver circuit with regulated current source). In simple gate driver circuits, a compromise is made between switching on and off. An optimum setting is not possible in this case.

The object underlying the invention is to specify an improved wiring for a semiconductor switch.

SUMMARY OF THE INVENTION

The object is achieved according to the invention by a wiring as set forth hereinafter.

Advantageous embodiments of the invention are the subject matter of the subclaims.

According to a first aspect of the present invention, a wiring of a semiconductor switch is proposed, comprising a gate, a collector or a drain and an emitter or a source, wherein the wiring comprises a capacitor between gate and collector or drain, wherein a parallel connection consisting of a resistor and a diode is provided in series with the capacitor.

In one embodiment, the diode is connected away from the gate in the flow direction. Therefore, only the switching-on behavior of the semiconductor switch is influenced and/or improved.

In one embodiment, the diode is connected toward the gate in the flow direction. Therefore, only the switching-off behavior of the semiconductor switch is influenced and/or improved.

In one embodiment, the diode is connected away from the gate in the flow direction, wherein connected in parallel with the arrangement consisting of capacitor, resistor and diode is a further arrangement consisting of a further capacitor, a further resistor and a further diode, wherein a parallel connection consisting of the further resistor and the further diode is provided in series with the further capacitor, wherein the further diode lies toward the gate in the flow direction. Therefore, the switching-on and switching-off behavior of the semiconductor switch are influenced and/or improved (independently of one another).

In one embodiment, a further capacitor is connected in parallel with the resistor and the diode.

According to a second aspect of the present invention, a wiring of a semiconductor switch is proposed, comprising a gate, a collector or a drain and an emitter or a source, wherein the wiring comprises a capacitor between gate and collector or drain, wherein provided in parallel with the capacitor is a circuit, in which a diode is connected in series with a parallel connection consisting of a resistor and a further capacitor.

In this case, the diode may be connected away from the gate or toward the gate in the flow direction.

In one embodiment, a gate resistor wiring is provided, comprising a first gate resistor connected at the gate, with which first gate resistor a series connection consisting of a second gate resistor and a gate diode is connected in parallel, wherein the gate diode is connected such that it permits a current flow toward the gate.

In one embodiment, the discharge resistor is connected in parallel with the capacitor or in parallel with the diode.

In one embodiment, the semiconductor switch is embodied as an IGBT or a MOSFET.

The advantages of the invention lie in the improved utilization of the semiconductor switch, caused by:
Decoupling of switching-on and switching-off behavior and separate adjustment of maximum and average switching edges.

This results in:
- lower switching-off overvoltage of the power semiconductor
- lower switching losses
- improved electromagnetic compatibility (EMC)
- possibility of more compact converter designs, due to lower power losses of the power semiconductors.

BRIEF DESCRIPTION OF THE DRAWING

The above-described properties, features and advantages of this invention and the manner in which these are achieved will become more clearly and easily intelligible in connection with the following description of exemplary embodiments, which are explained in further detail with reference to the drawings, in which.

DETAILED DESCRIPTION OF PREFERRED EMBODIMENTS

Figure 1:
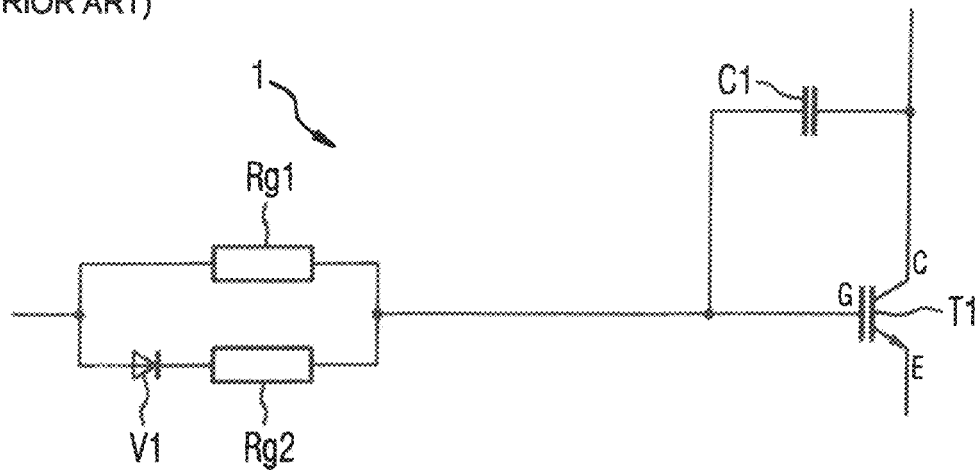
FIG. 1 shows a wiring of a semiconductor switch which is known from the prior art.

Parts which correspond to one another are provided with the same reference characters in all the figures.

FIG. 1 shows a wiring 1 of a semiconductor switch T1 which is known from the prior art. The semiconductor switch T1 is, for example, a field-effect transistor, in particular a MOSFET or an IGBT, and has a gate G, a collector C and an emitter E. A capacitor C1 is arranged between collector C and gate G. A gate wiring consisting of a first gate resistor Rg1, a second gate resistor Rg2 and a gate diode V1 is depicted, which symbolizes the gate resistor as embodied above in the introduction.

Figure 2:
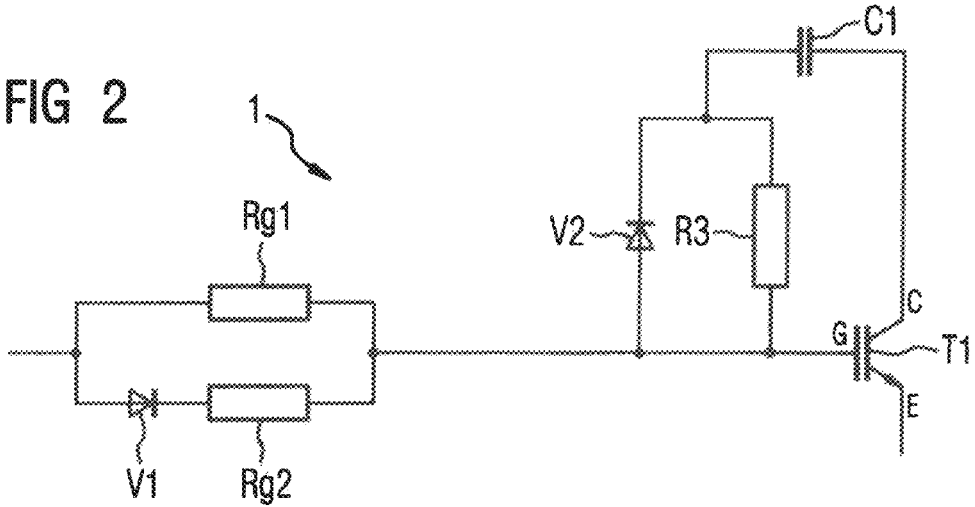
FIG. 2 shows a first embodiment of a wiring of a semiconductor switch.

FIG. 2 shows a first embodiment of a wiring 1 of a semiconductor switch T1.

The semiconductor switch T1 is, for example, a field-effect transistor, in particular a MOSFET or an IGBT, and has a gate G, a collector C and an emitter E. A capacitor C1 is arranged between collector C and gate G. A gate wiring consisting of a first gate resistor Rg1, a second gate resistor Rg2 and a gate diode V1 is depicted, which symbolizes the gate resistor as embodied above in the introduction. Unlike in FIG. 1, however, a parallel connection consisting of a resistor R3 and a diode V2 is provided between collector C and gate G in series with the capacitor C1, wherein the diode V2 is connected away from the gate G in the flow direction.

By integrating the diode V2, the interventions of the capacitor C1 for switching on and off are decoupled from one another. With the embodiment shown in FIG. 2, only the switching-on behavior is influenced and/or improved.

The resistor R3 is used to discharge the capacitor C1 when this is not possible by way of the diode V2 by operating in its reverse direction.

The orientation of the diode V2 determines whether the wiring 1 acts when switching the semiconductor switch T1 on or off.

Figure 3:
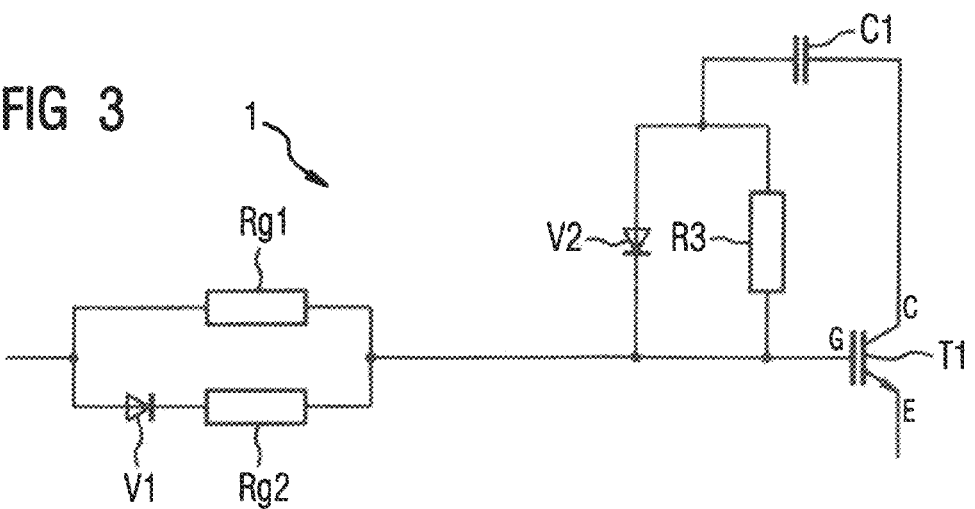
FIG. 3 shows a second embodiment of a wiring of a semiconductor switch.

FIG. 3 shows a second embodiment of a wiring 1 of a semiconductor switch T1.

The wiring 1 is similar to the wiring 1 shown in FIG. 2. Unlike there, however, the diode V2 is connected toward the gate G in the flow direction.

By integrating the diode V2, the interventions of the capacitor C1 for switching on and off are decoupled from one another. With the embodiment shown in FIG. 3, only the switching-off behavior is influenced and/or improved.

The resistor R3 is used to discharge the capacitor C1 when this is not possible by way of the diode V2 by operating in its reverse direction.

Figure 4:
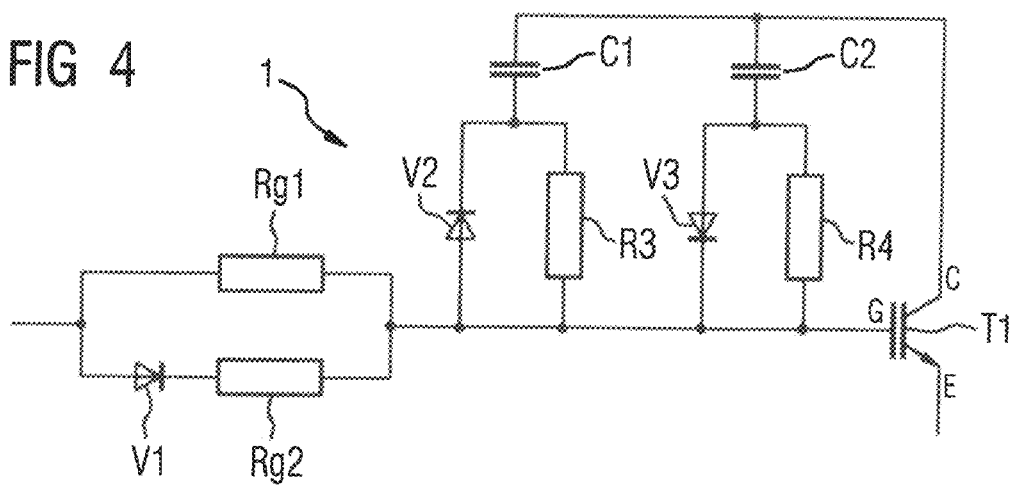
FIG. 4 shows a third embodiment of a wiring of a semiconductor switch.

FIG. 4 shows a third embodiment of a wiring 1 of a semiconductor switch T1.

The wiring 1 combines the wirings 1 shown in FIGS. 2 and 3.

A parallel connection consisting of a resistor R3 and a diode V2 is provided between collector C and gate G in series with the capacitor C1, wherein the diode V2 is connected away from the gate G in the flow direction. Connected in parallel with the arrangement consisting of capacitor C1, resistor R3 and diode V2 is a further arrangement consisting of a further capacitor C2, a further resistor R4 and a further diode V3, wherein the further capacitor C2 lies next to the collector C, for example, and a parallel connection consisting of the further resistor R4 and the further diode V3 is provided in series with the further capacitor C2, wherein the further diode V3 lies toward the gate G in the flow direction.

With the embodiment shown in FIG. 4, the switching-on and switching-off behavior are influenced and/or improved separately from one another.

Figure 5:
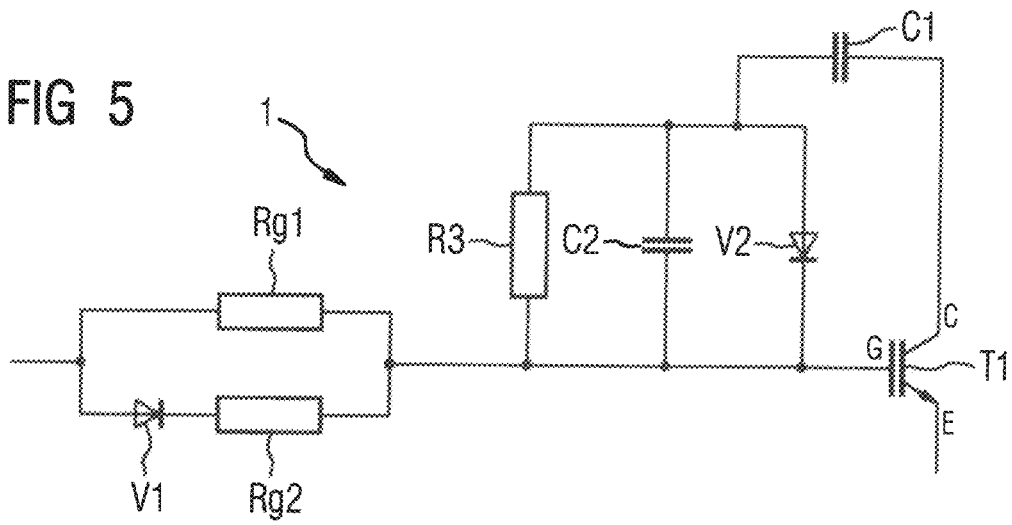
FIG. 5 shows a fourth embodiment of a wiring of a semiconductor switch.

FIG. 5 shows a fourth embodiment of a wiring 1 of a semiconductor switch T1.

The wiring 1 is similar to the wiring 1 shown in FIG. 3. Unlike there, a further capacitor C2 is connected in parallel with the resistor R3 and the diode V2.

Figure 6:
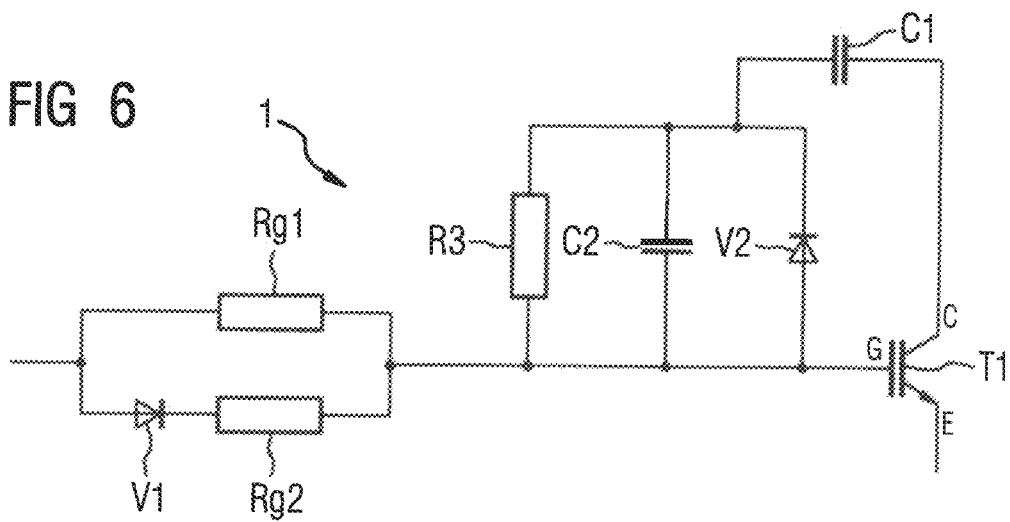
FIG. 6 shows a fifth embodiment of a wiring of a semiconductor switch.

FIG. 6 shows a fifth embodiment of a wiring 1 of a semiconductor switch T1.

The wiring 1 is similar to the wiring 1 shown in FIG. 2. Unlike there, a further capacitor C2 is connected in parallel with the resistor R3 and the diode V2.

Figure 7:
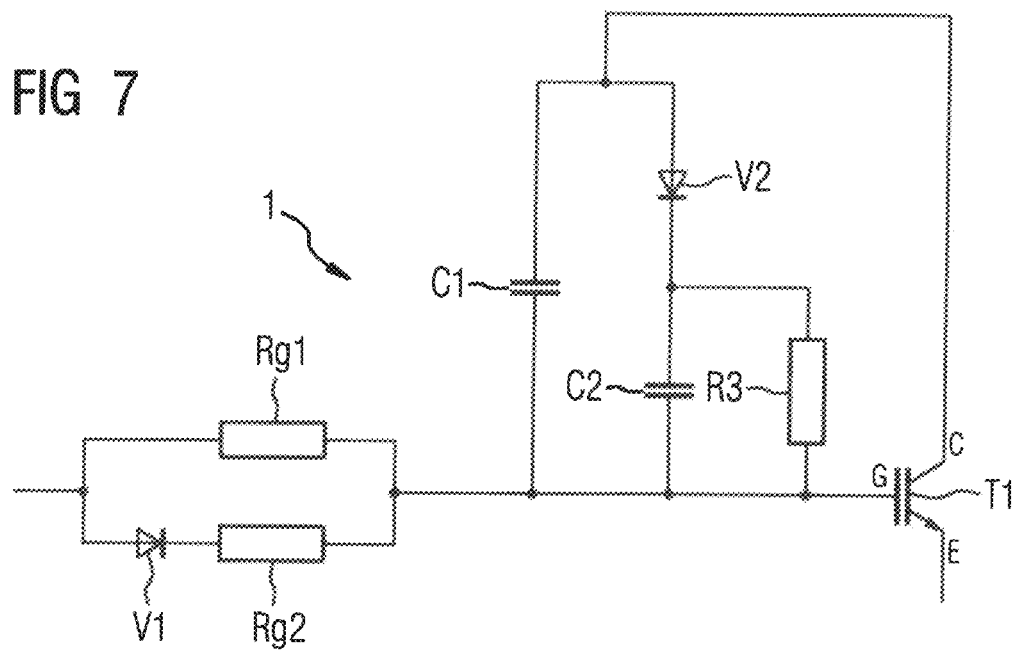
FIG. 7 shows a sixth embodiment of a wiring of a semiconductor switch.

FIG. 7 shows a sixth embodiment of a wiring 1 of a semiconductor switch T1.

The wiring 1 is similar to the wiring 1 shown in FIG. 1. Unlike there, however, provided in parallel with the capacitor C1 is a circuit, in which a diode V2 is connected in series with a parallel connection consisting of a resistor R3 and a further capacitor C2. In this case, the diode V2 is connected toward the gate G in the flow direction.

Figure 8:
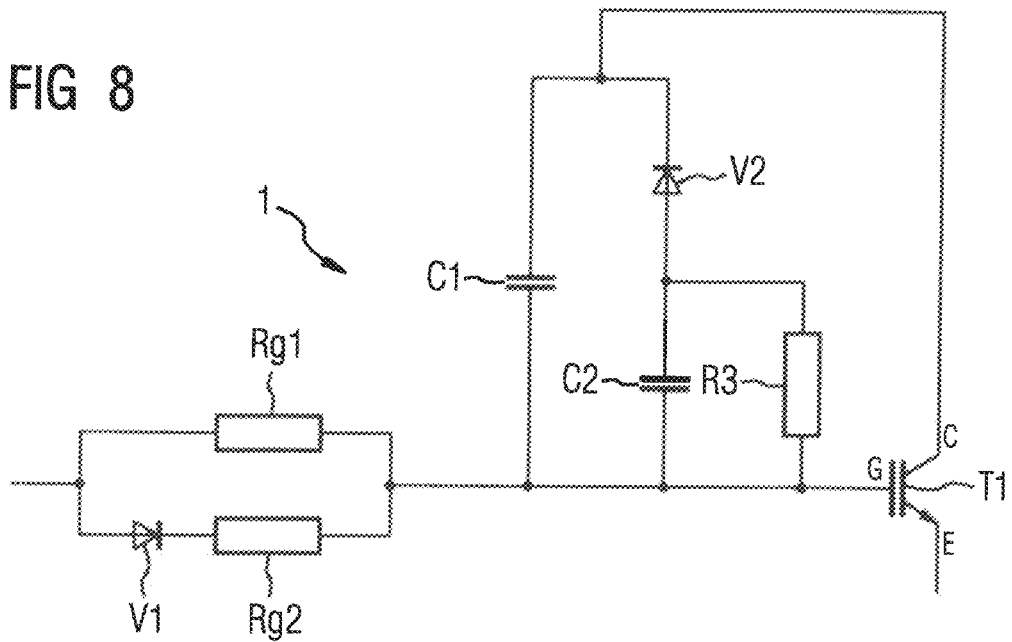
FIG. 8 shows a seventh embodiment of a wiring of a semiconductor switch.

FIG. 8 shows a seventh embodiment of a wiring 1 of a semiconductor switch T1.

The wiring 1 is similar to the wiring 1 shown in FIG. 1. Unlike there, however, provided in parallel with the capacitor C1 is a circuit, in which a diode V2 is connected in series with a parallel connection consisting of a resistor R3 and a further capacitor C2. In this case, the diode V2 is connected away from the gate G in the flow direction.

In one embodiment, the resistor R3 is connected in parallel with the further capacitor C2 or in parallel with the diode V2.

Although the invention has been illustrated and described in detail on the basis of preferred exemplary embodiments, the invention is not restricted by the examples given and other variations can be derived therefrom by a person skilled in the art without departing from the protective scope of the invention.

What is claimed is:

1. A wiring of a semiconductor switch having a gate, a collector or a drain, and an emitter or a source, the wiring comprising:
    a first arrangement comprising a first capacitor connected in series with a parallel connection having a first resistor and a first diode, said first arrangement connected between the gate and the collector or drain, wherein the first diode is connected away from the gate in a flow direction, and
    a second arrangement connected in parallel with the first arrangement and comprising a second capacitor connected in series with a parallel connection having a second resistor and a second diode, wherein the second diode lies toward the gate in the flow direction.

2. The wiring of claim 1, further comprising a gate resistor wiring connected to the gate and comprising a first gate resistor connected in parallel with a series connection having a second gate resistor and a gate diode which is connected toward the gate in the flow direction.

3. The wiring of claim 1, wherein the semiconductor switch is embodied as an IGBT or a MOSFET.

* * * * *